July 11, 1967 W. J. JOHNSTON 3,331,033
TRANSISTOR OSCILLATOR POWER SUPPLY SYSTEM
Filed Sept. 10, 1964
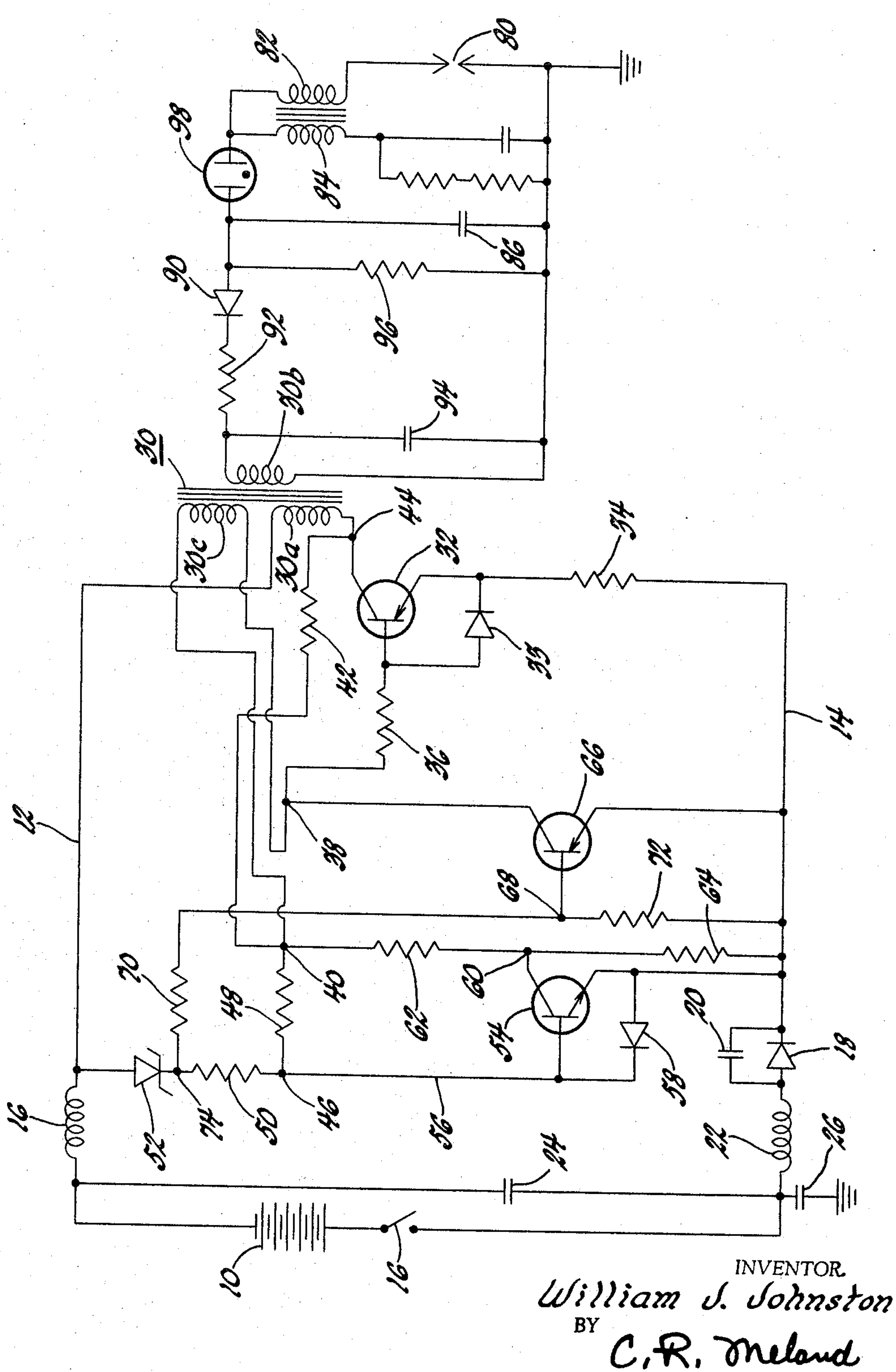
INVENTOR.
*William J. Johnston*
BY *C. R. Meland*
HIS ATTORNEY

United States Patent Office 3,331,033

Patented July 11, 1967

3,331,033

TRANSISTOR OSCILLATOR POWER SUPPLY SYSTEM

William J. Johnston, Flint, Mich., assignor to General Motors Corporation, Detroit, Mich., a corporation of Delaware Filed Sept. 10, 1964, Ser. No. 395,416

5 Claims. (Cl. 331—113)

This invention relates to a blocking transistor oscillator type of power supply system which includes means for protecting the oscillator against overvoltage conditions and which is useful as a power supply for a turbine ignition system.

It is well known to provide a transistor oscillator which is of the blocking type and which employs a transistor and a transformer having a primary winding, a secondary winding and a tertiary winding. This general type of oscillator circuit has been described in an article entitled, "Transistor Power Supplies," published in the December 1955 issue of "Wireless World."

The present invention is concerned with providing a system which will protect the oscillator and particularly the transistor which forms a part of the oscillator against an overvoltage condition. Thus, where the oscillator is used to power an ignition system for aircraft and where the normal 28 volt direct current supply is used to supply the oscillator, transients as high as 80 volts can occur. The present invention includes means for protecting the system against such overvoltage conditions which would otherwise result in transistor voltages, currents and power levels exceeding design values and resulting in a transistor failure.

It accordingly is one of the objects of this invention to provide a transistor oscillator circuit which includes means for protecting the system against a high input voltage condition.

Another object of this invention is to provide an ignition system which is powered by a transistor oscillator and wherein means are provided for protecting the transistor oscillator against abnormal, high voltage inputs.

Still another object of this invention is to provide a transistor oscillator with means for stabilizing the output of the oscillator and also with means for protecting the oscillator against abnormally high input voltages.

A further object of this invention is to provide an ignition system that is powered by a transistor oscillator and wherein the transistor oscillator has means for stabilizing its output and also includes means for protecting the oscillator against high input voltages.

Further objects and advantages of the present invention will be apparent from the following description, reference being had to the accompanying drawings wherein a preferred embodiment of the present invention is clearly shown.

In the drawing:

The single figure drawing is a schematic circuit diagram of a transistor oscillator and ignition system made in accordance with this invention.

The transistor oscillator of this invention is to be described in connection with an ignition system but it is to be understood by those skilled in the art that the features of the transistor oscillator such as the overvoltage protection feature which is to be described could be used where the transistor oscillator is to power loads other than an ignition system.

Referring now to the drawing, the reference numeral 10 designates a source of direct current which may be, for example, a twenty-eight volt D.C. supply on an aircraft. The source of direct current 10 is applied to power supply conductors 12 and 14 whenever the switch 16 is closed. It is seen that an inductance 17 is connected in series with line 12 while a diode 18 is connected in series with the line 14. The purpose of the diode 18 is to prevent the system from being energized in the event that the source 10 is connected with a wrong polarity to the system. A capacitor 20 is connected in parallel with the diode 18 and this diode is connected in series with an inductance 22. A capacitor 24 is connected across the direct current source 10 when the switch 16 is closed and another capacitor 26 connects the positive power line to ground.

The oscillator portion of the system of this invention includes a transformer generally designated by reference numeral 30. This transformer has a primary winding 30*a*, a secondary winding 30*b* and a feedback or tertiary winding 30*c*. These windings are all wound on a common core as is known to those skilled in the art.

The oscillator includes a PNP transistor 32. The collector of transistor 32 is connected to one side of the primary 30*a*, the opposite side of the primary being connected with power lead 12. The emitter of transistor 32 is connected with power lead 14 through a small resistor 34 which may be for example, .3 ohm. In some instances, the resistor 34 is not required and in such an arrangement, the emitter of transistor 32 is connected directly with power lead 14. The base of transistor 32 is connected to one side of a resistor 36, the opposite side of the resistor being connected with junction 38. The tertiary winding 30*c* of the transformer 30 is connected between junctions 38 and 40. A resistor 42 connects the junction 40 and a junction 44 that is connected with the collector of transistor 32.

The junction 40 is connected with junction 46 through a resistor 48. The junction 46 is connected to power conductor 12 through a resistor 50 and a Zener diode 52.

The system of this invention includes another transistor 54 which is of the NPN type. The base of transistor 54 is connected with junction 46 by a conductor 56. The emitter of transistor 54 is connected with power lead 14. A diode 58 connects the emitter and base electrodes of transistor 54. The collector of transistor 54 is connected with a junction 60 which is between resistors 62 and 64.

The system has another transistor 66 which is of the PNP type. This transistor as will be more fully described provides overvoltage protection for the oscillator circuit. The collector of transistor 66 is connected with junction 38 while the emitter is connected with power lead 14. The base of transistor 66 is connected with junction 68 located between resistors 70 and 72. The opposite side of resistor 72 is connected with power lead 14 while the opposite side of resistor 70 is connected with junction 74 and therefore to one side of the Zener diode 52.

The secondary winding 30*b* of the system feeds an ignition system which includes a spark discharge device 80. The spark discharge device 80 is connected with the secondary winding 82 of an ignition coil which has a primary winding 84. The ignition system includes a capacitor 86 which can be charged through diode 90 and resistor 92. A capacitor 94 is connected across the secondary winding 30*b* and a resistor 96 is connected across capacitor 86. A tube 98 having a predetermined breakdown voltage is connected between capacitor 86 and the ignition coil. The primary winding 84 of the ignition coil is connected with a resistor-capacitor combination as shown.

The ignition system is conventional and when the transistor oscillator is operating, the capacitor 86 is charged through the diode 90 from the pulsating current that is developed in the secondary winding 30*b*. When the capacitor is charged to a voltage sufficient to break down the tube 98, the capacitor discharges causing a spark to jump the spark discharge device 80 which can be used to ignite the combustible mixture of a turbine engine.

The spark discharge device 80 is continuously firing at a periodic rate as long as the oscillator is energized.

The transistor 66 and resistors 70 and 72 provide an over-voltage protection circuit for the ignition system of this invention. Thus, if the voltage appearing between conductors 12 and 14 rises to some abnormally high value, the Zener diode 52 will break down in its reverse direction and current will flow from conductor 14, through resistor 72, through resistor 70 and through the Zener diode 52 to conductor 12.

The ratio of resistors 70 and 72 is selected such that the voltage developed across resistor 72 will bias the transistor 66 to a conductive condition when the voltage appearing across conductors 12 and 14 is slightly above a voltage which will break down the Zener diode 52. This arrangement is provided because the Zener diode also controls the conduction of a stabilizing transistor 54, the function of which will be described hereinafter.

When transistor 66 is conductive in its emitter-collector circuit, the emitter to base circuit of transistor 32 is bypassed and as a result, the transistor 32 will be turned off in its emitter-collector circuit as long as the abnormally high voltage condition exists. Under this condition, the transistor 32 will only carry small leakage current and only the line voltage will be impressed across it as no voltages will be reflected from the transformer 30. This arrangement effectively protects the transistor 32 from abnormally high input voltages When the overvoltage condition passes, the Zener diode 52 will stop conducting and transistor 66 will return to its normal nonconducting state and the switching circuit including transistor 32 will return to its normal switching mode.

The diode 33 while not required for the overvoltage turnoff circuit that has been described, increases the circuit reliability by limiting the reverse polarity of the emitter-base junction of transistor 32 to a low value during normal oscillator operation.

It has been pointed out that the transistor 54 is a stabilizing transistor. To more fully explain this, it is known that when the input voltage appearing between conductors 12 and 14 increases, the peak value of input current will also increase and that as the resistance from junction 40 to the emitter of transistor 32 is increased, the peak current will decrease. The purpose of transistor 54 is to control the amount of resistance connecting junction 40 and the emitter of transistor 32 which includes resistor 62 and resistor 64 together with resistor 34 although resistor 34 is of a very small value and in some instances may not be required. It can be seen that when transistor 54 is conductive, the resistance of the circuit between junction 40 and the emitter of transistor 32 will be reduced since the resistor 64 will be bypassed. On the other hand, when transistor 54 is nonconductive, the resistance of this circuit is increased.

The conduction of transistor 54 is controlled in response to the voltage appearing between conductors 12 and 14. This control is achieved by the Zener diode 52. Thus when the Zener diode first breaks down, the transistor 54 is biased to a nonconductive condition by current flow through the diode 58, conductor 56, resistor 50 and through Zener diode 52. Thus as the input voltage increases, the resistance between junction 40 and the emitter of transistor 32 is increased to compensate for the increased input voltage.

When the voltage appearing between leads 12 and 14 is of such a value that Zener diode 52 does not break down, the transistor 54 is conductive to reduce the resistance of the circuit between junction 40 and the emitter of transistor 32 to again compensate for the voltage across conductors 12 and 14.

The biasing arrangement for transistors 54 and 66 is such that transistor 54 turns off at a lower voltage between conductors 12 and 14 than the voltage required to bias transistor 66 to a conductive condition. Thus when the Zener diode 52 initially breaks down, transistor 54 will be biased to a nonconductive condition but a higher voltage between conductors 12 and 14 is required in order to turn on transistor 66. The Zener diode is the voltage reference element for both transistors 54 and 66.

To summarize operation of the transistor oscillator, it will be appreciated that transistor 32 switches on and off continuously to make and break the circuit for primary winding 30*a*. Since primary winding current is switched on and off, a current is induced in the secondary winding 30*b* which is pulsating and which supplies power to fire the spark discharge device 80. During the operation of the transistor oscillator, the transistor 66 and its associated circuitry provides overvoltage protection while the transistor 54 and its associated circuitry provides stabilization of operation of the transistor oscillator against input voltage variations.

While the embodiment of the present invention as herein disclosed, constitutes a preferred form, it is to be understood that other forms might be adopted.

What is claimed is as follows:

1. A transistor oscillator comprising, first and second conductors connected with a source of direct current, a transformer having a primary winding, a secondary winding and a tertiary winding, said secondary winding being adapted to feed an electrical load, a first transistor having emitter, collector and base electrodes, means connecting the emitter and collector electrodes of said first transistor and said primary winding in series across said conductors, a base circuit for said first transistor connecting the emitter and base electrodes of said first transistor and including in a series connection said tertiary winding, a second transistor having emitter and collector electrodes connected across the emitter and base electrodes of said first transistor whereby said first transistor is biased non-conductive when said second transistor is biased conductive, means coupled to the emitter and base electrodes of said second transistor for biasing said second transistor conductive when the voltage appearing across said conductors exceeds a first predetermined value, a third transistor having emitter, collector and base electrodes, means for controlling the effective resistance of said base circuit, said last-named means including the emitter collector circuit of said third transistor, and means for biasing said third transistor toward a nonconductive state to increase the effective resistance of said base circuit when the voltage appearing across said conductors is above a second predetermined value which is lower than said first predetermined value.

2. A transistor oscillator comprising, first and second conductors, a source of direct current connected across said conductors, a transformer having a primary winding, a secondary winding and a tertiary winding, said secondary winding being adapted to be connected with an electrical load, a first transistor having emitter, collector and base electrodes, means connecting the emitter and collector electrodes of said first transistor and said primary winding in series across said conductors, a second transistor having emitter, collector and base electrodes, a voltage sensing circuit connected across said conductors including a junction and a Zener diode, means connecting the emitter and collector of said second transistor respectively with the emitter and base of said first transistor whereby the conduction of said second transistor determines the voltage applied across the emitter and base electrodes of said first transistor, means connecting the base of said second transistor with said junction of said voltage sensing circuit whereby said base responds to the value of voltage appearing across said conductors, a base circuit connecting the emitter and base electrodes of said first transistor including in a series connection said tertiary winding of said transformer, a third transistor having emitter, collector and base electrodes, means for varying the effective resistance of said base circuit including the emitter and collector circuit of said third transistor, and means for controlling the voltage applied to the base of said third transistor as a function of the voltage applied across said conductors, said last named means comprising a circuit connecting said base of said third transistor and said Zener diode.

3. A transistor oscillator comprising, first and second conductors connected with a source of direct current, a transformer having a primary winding, a secondary winding and a tertiary winding, said secondary winding being adapted to feed an electrical load, a first transistor having emitter, collector and base electrodes, means connecting the emitter and collector electrodes of said first transistor and said primary winding in series across said conductors, a base circuit for said first transistor connecting the emitter and base electrodes of said first transistor and including in a series connection said tertiary winding, a second transistor having emitter, collector and base electrodes, means connecting the emitter and collector of said second transistor respectively with the emitter and base of said first transistor whereby the voltage applied to the emitter and base of said first transistor is determined by the conduction of said second transistor in its emitter-collector circuit, a third transistor having emitter, collector and base electrodes, the emitter and collector electrodes of said third transistor being connected in said base circuit that connects the emitter and base electrodes of said first transistor, first and second voltage dividing networks connected across said conductors, a Zener diode forming a part of each voltage dividing network connected between one of said conductors and said first and second voltage dividing networks, means connecting the base of said second transistor with said first voltage dividing network and means connecting the base of said third transistor with said second voltage dividing network.

4. The transistor oscillator according to claim 3 where the second voltage dividing network includes a diode connected across the emitter and base electrodes of the third transistor.

5. The transistor oscillator according to claim 3 where the emitter and collector electrodes of the third transistor are connected across a resistor, said resistor being connected in series with said tertiary winding in said base circuit of said first transistor.

References Cited

UNITED STATES PATENTS

| | | | |
|---|---|---|---|
| 3,114,096 | 12/1963 | Projain | 331—109 |
| 3,127,540 | 3/1964 | Collins | 315—209 |
| 3,136,958 | 6/1964 | Murphy | 331—62 |
| 3,206,695 | 9/1965 | Murphy | 331—113 |

JOHN W. HUCKERT, *Primary Examiner.*

D. O. KRAFT, R. SANDLER, *Assistant Examiners.*